(12) United States Patent
Nakamura et al.

(10) Patent No.: US 7,808,358 B2
(45) Date of Patent: Oct. 5, 2010

(54) INDUCTOR AND METHOD FOR FABRICATING THE SAME

(75) Inventors: Atsushi Nakamura, Hyogo (JP); Shinichiro Hayashi, Osaka (JP); Teruhito Ohnishi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/428,714

(22) Filed: Apr. 23, 2009

(65) Prior Publication Data

US 2009/0273429 A1 Nov. 5, 2009

(30) Foreign Application Priority Data

May 1, 2008 (JP) .............................. 2008-119507

(51) Int. Cl.
*H01F 5/00* (2006.01)
*H01F 7/06* (2006.01)

(52) U.S. Cl. ..................... 336/200; 336/223; 336/232; 29/602.1

(58) Field of Classification Search ................ 336/200, 336/223, 232; 29/602.1
See application file for complete search history.

(56) References Cited

U.S. PATENT DOCUMENTS

| 4,075,591 | A | 2/1978 | Haas |
| 5,445,922 | A * | 8/1995 | Maple ..................... 430/314 |
| 6,201,215 | B1 * | 3/2001 | Person et al. .......... 219/121.72 |
| 6,366,192 | B2 * | 4/2002 | Person et al. ............... 336/200 |
| 7,370,403 | B1 | 5/2008 | Hsu et al. |
| 2002/0067235 | A1 | 6/2002 | Ueda et al. |
| 2008/0157913 | A1 | 7/2008 | Kim |
| 2008/0174398 | A1 * | 7/2008 | Hsu et al. ................... 336/200 |

FOREIGN PATENT DOCUMENTS

JP 2002-134319 A 5/2002

* cited by examiner

*Primary Examiner*—Anh T Mai
(74) *Attorney, Agent, or Firm*—McDermott Will & Emery LLP (57) ABSTRACT

An inductor includes a flat substrate and a conductor in a spiral shape having a plurality of turns. The plane on which the conductor is formed is substantially in parallel with a principal surface of the substrate. The turns of the conductor are equally spaced from each other in a direction parallel to the plane on which the conductor is formed. An outer one of the turns of the conductor is wider and thinner than an inner one of the turns of the conductor. A level of at least one of a top and a bottom of the conductor differs from one turn to another in a cross section vertical to the plane on which the conductor is formed.

12 Claims, 8 Drawing Sheets

INDUCTOR AND METHOD FOR FABRICATING THE SAME

CROSS-REFERENCE TO RELATED APPLICATION

This application claims priority from Japanese Patent Application No. JP2008-119507 filed on May 1, 2008, which is hereby incorporated by reference in its entirety for all purposes.

BACKGROUND

The present disclosure generally relates to an inductor including a substrate and a spiral inductor formed on the substrate, and to a method for fabricating the inductor.

With recent widespread use of cellular phones and personal digital assistants (PDAs), there has been an increasing demand for reducing the size of high-frequency circuits with wireless interfaces. To meet with this demand, passive components, such as inductors, which used to be provided outside semiconductor devices, e.g., mounted on printed wiring boards (i.e., passive components which used to be external components) are housed in the semiconductor devices in many cases. Inductors are components necessary for application to the design of radio frequency integrated circuits (RFICs) such as low noise amplifiers (LNAs), power amplifiers (PAs), radio frequency (RF) oscillators. However, as compared to resistors and capacitors that are relatively easily formed within chips, inductors have various structures for acquiring inductive properties, and are not necessarily easily formed within chips.

Figure 8A:
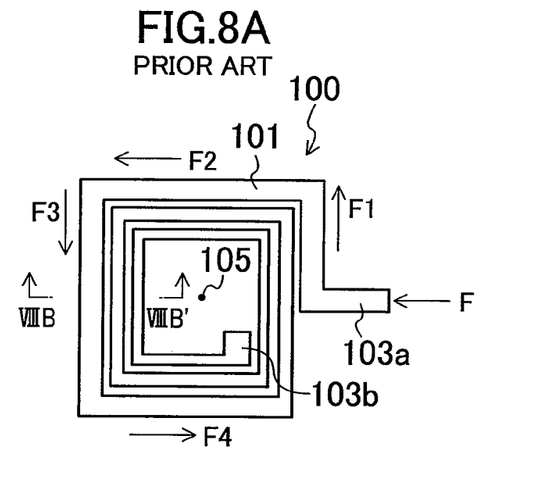
FIG. 8A is a plan view illustrating a conventional inductor.
Figure 8B:
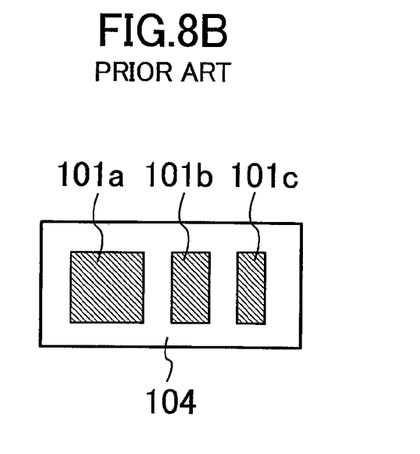
FIG. 8B is a cross-sectional view of the conventional inductor.

A conventional technique (e.g., a technique disclosed in Japanese Laid-Open Patent Publication No. 2002-134319) is now described with reference to FIGS. 8A and 8B. FIG. 8A is a plan view illustrating an inductor. FIG. 8B is a cross-sectional view taken along line VIIIB-VIIIB' in FIG. 8A.

As illustrated in FIG. 8A, an inductor 100 has a structure where a conductor 101 is in a spiral shape. The outer and inner ends of the conductor 101 serve as a terminal 103a and a terminal 103b respectively. Current F which has entered the terminal 103a flows in the direction indicated by arrows F1, F2, F3, and F4, in this order, and is obtained from the terminal 103b.

As illustrated in FIG. 8B, the inductor 100 (having turns 101a, 101b, and 101c) is provided in an interlayer insulating film 104 formed on a substrate. The conductor 101 is rectangular in a cross sectional taken along the width of the conductor 101.

To describe characteristics of an inductor, a quality factor (Q factor) is generally used, and is expressed as:

$$Q = \omega L / R \quad (1)$$

where $\omega$ is $2\pi f$, $\pi$ is a circle ratio, f is a frequency, L is an inductance, and R is a resistance.

It is considered that as the Q factor increases, electric characteristics of the inductor are enhanced. A large Q factor contributes to reduction of power consumption of a circuit.

It is well known that the series resistance of a spiral inductor is a main cause of a decrease in the Q factor of the inductor. One of measures for reducing the series resistance of the inductor is using a wide conductor. However, an increase in the width of the conductor increases the area of the inductor, thereby disadvantageously increasing parasitic capacitance relating to the structure. Consequently, the self-resonant frequency of the inductor decreases, thus limiting the effective frequency of the inductor.

In the inductor 100 illustrated in FIG. 8A, the turns 101a through 101c of the conductor 101 are equally spaced from each other, and the inner turn 101c is narrower than the outer turn 101a. Accordingly, the distance from a center 105 to the inner turn 101c is larger than that in a configuration in which the inner turn 101c and the outer turn 101a have the same width. Consequently, each of opposing turns of the conductor 101 is not greatly affected by the line of magnetic force of the other turn. As a result, the inductance L increases, thus causing an increase in the Q factor.

Figure 9:
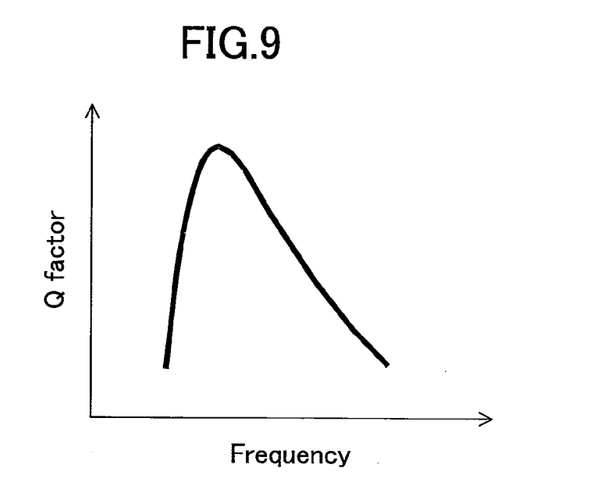
FIG. 9 is a graph showing a correlation between the Q factor of an inductor and a frequency.

FIG. 9 shows a Q characteristic (i.e., a variation of the Q factor with respect to the frequency) of a general inductor. As shown in FIG. 9, as the frequency increases, the Q factor temporarily increases. However, in a high-frequency range, the Q factor decreases because of a capacitive loss due to capacitive coupling between the inductor and the substrate. As a result, the Q characteristic has a convex shape which curves upward.

According to Equation (1), to increase the Q factor, reduction of the series resistance of the inductor and suppression of the capacitive loss are effective.

SUMMARY

However, the above-described conventional configuration has the following drawbacks.

First, with an increase in the drive frequency, current tends to concentrate near the surfaces (i.e., the upper and lower surfaces and both side surfaces in the case of a configuration where a conductor is rectangular in cross section, such as turns 101a, 101b, and 101c in FIG. 8B) of a conductor due to the skin effect. In addition, a magnetic field is produced in energizing an inductor. Accordingly, in a spiral conductor, there is a tendency for the magnetic flux density to be higher in an inner turn of the spiral than in an outer turn of the spiral, thus causing current to concentrate in the inner turn. When the current concentrates in the inner turn of the conductor, the substantial series resistance of the inductor increases, and thus the Q factor of the inductor decreases. To reduce the influence of the magnetic field produced during energizing operation, it will be effective to increase the distance from the center of the inductor to the conductor. Moreover, to prevent an increase in the area occupied by the inductor, measures such as reduction of the conductor width or reduction of the conductor pitch are conceivable. However, the reduction of the conductor width increases the series resistance of the inductor, resulting in a decrease in the Q factor of the inductor. The reduction of the conductor pitch increases capacitance between turns of the conductor, resulting in a decrease in the Q factor of the inductor in a high-frequency range.

To increase the Q factor of the inductor, it will be effective to increase the thickness of the conductor of the inductor. However, in the conventional inductor, the adjacent turns 101a and 101b; and 101b and 101c as shown in FIG. 8B affect each other, and thus capacitance arises as the thickness of the turns 101a, 101b, and 101c increases. Consequently, the capacitance between turns of the conductor increases, thus causing a decrease in the Q factor of the inductor in a high-frequency range. Therefore, it is necessary to overcome these drawbacks.

An example inductor of this disclosure includes: a flat substrate; and a conductor in a spiral shape having a plurality of turns. The conductor is provided substantially in parallel with a principal surface of the substrate. The turns of the conductor are equally spaced from each other in a direction parallel to a plane on which the conductor is formed. An outer one of the turns of the conductor is wider and thinner than an inner one of the turns of the conductor. A level of at least one of a top and a bottom of the conductor differs from one turn to another in a cross section vertical to the plane on which the conductor is formed.

In the spiral conductor with the structure described above, an inner turn is narrower and thicker than an outer turn, and thus the level of at least one of the top and the bottom of a turn differs from that of its adjacent turn. Accordingly, a magnetic flux component vertical to the plane on which the conductor is formed can be reduced, resulting in reduction of the total eddy current loss. That is, reduction of a component (vertical component) of magnetic flux linking the conductor can reduce the total eddy current loss, thus suppressing an increase in the substantial series resistance of the inductor. In addition, the structure in which the conductor is not uniformly thick can suppress an increase in capacitance of the inductor, thus suppressing a capacitive loss.

In the example inductor, a top of an inner one of the turns of the conductor may be flush with or below a top of an outer one of the turns of the conductor in a cross section vertical to the plane on which the conductor is formed.

Such a structure can increase the distance between adjacent turns of the spiral conductor, thus reducing the influence of a magnetic field produced in energizing the inductor, for example. In addition, a magnetic flux component vertical to the plane on which the conductor is formed can be reduced, thus reducing the total eddy current loss. As a result, an increase in the substantial series resistance can be suppressed. Furthermore, capacitance between adjacent turns of the conductor can be reduced, thus suppressing a decrease in the Q factor of the inductor in a high-frequency range.

In the example inductor, a bottom of an inner one of the turn of the conductor may be flush with or above a bottom of an outer one of the turns of the conductor in a cross section vertical to the plane on which the conductor is formed.

Such a structure can increase the distance between adjacent turns of the spiral conductor, thus reducing the influence of a magnetic field produced in energizing the inductor, for example. In addition, a magnetic flux component vertical to the plane on which the conductor is formed can be reduced, thus reducing the total eddy current loss. As a result, an increase in the substantial series resistance can be suppressed. Furthermore, capacitance between adjacent turns of the conductor can be reduced, thus suppressing a decrease in the Q factor of the inductor in a high-frequency range.

DETAILED DESCRIPTION

Hereinafter, embodiments of the present invention will be described with reference to the drawings. The present invention is not limited to the following embodiments.

Embodiment 1

Figure 1A:
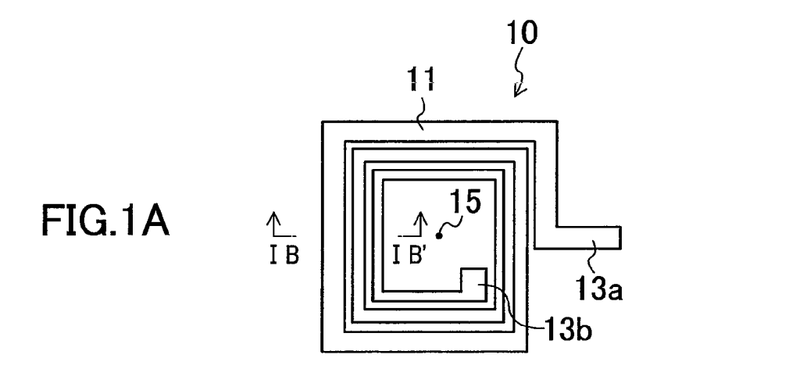
FIG. 1A is a plan view illustrating an inductor according to a first embodiment of the present invention.
Figure 1B:
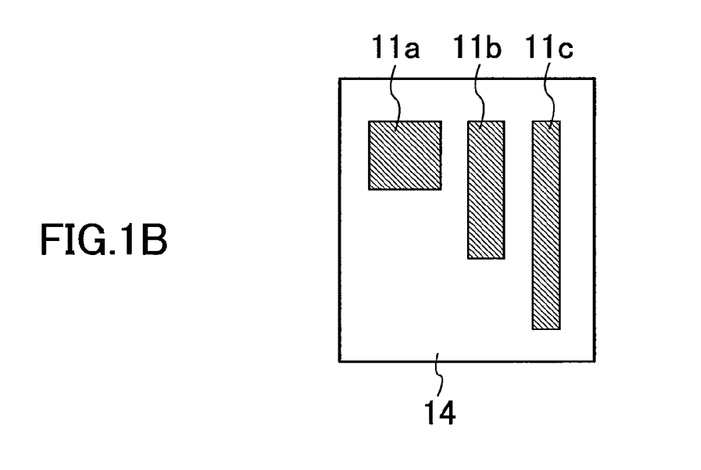
FIG. 1B is a cross-sectional view of the inductor of the first embodiment.
Figure 1C:
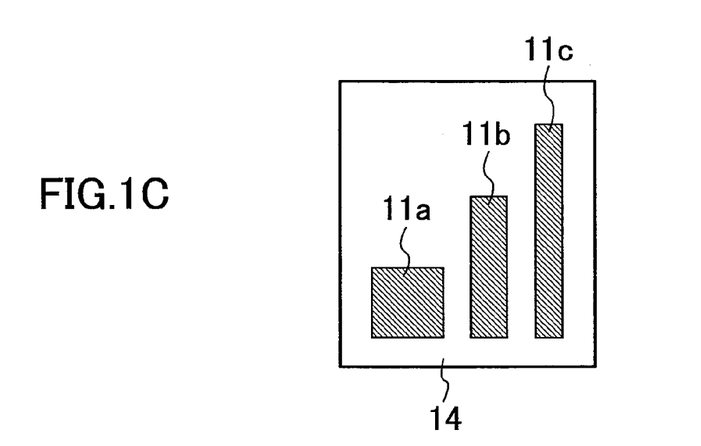
FIG. 1C is a cross-sectional view of another inductor according to the first embodiment.

FIG. 1A is a plan view illustrating an inductor 10 having a spiral shape according to a first embodiment of the present invention. FIG. 1B is a cross-sectional view taken along line IB-IB' in FIG. 1A. FIG. 1C is another example of the cross-sectional view taken along line IB-IB' in FIG. 1A.

As illustrated in FIG. 1A, the inductor 10 includes a substrate (not shown) and a conductor 11 having a spiral shape. The outer and inner ends of the conductor 11 serve as a terminal 13a and a terminal 13b respectively. Current which has entered the terminal 13a is obtained from the terminal 13b. As illustrated in FIG. 1B, the conductor 11 (only whose turns 11a, 11b, and 11c are shown in FIG. 1B) is provided in an interlayer insulating film 14 formed on the substrate. Each of the turns 11a, 11b, and 11c is rectangular in a cross section taken along the width of the turns 11a, 11b, and 11c.

Referring now to FIG. 1B, the bottom of the conductor 11 is located at different levels in different turns in this embodiment. For example, in the conductor 11 illustrated in FIG. 1B, the bottom of the innermost turn 11c is located at the lowest level, the bottom of the intermediate turn 11b is located at an intermediate level, and the outermost turn 11a is located at the highest level. This structure can reduce a magnetic flux component vertical to the plane on which the conductor 11 is formed, thus reducing the total eddy current loss. That is, in the conductor 11 of this embodiment, a vertical component of magnetic flux linking the conductor 11 can be reduced, thus reducing the total eddy current loss. Consequently, the series resistance of the inductor 10 can be reduced, resulting in preventing a decrease in the Q factor of the inductor 10.

To implement such a structure of the conductor 11, an inner turn is made thicker than an outer turn, and the tops of these turns are flush with each other in this embodiment. Alternatively, as illustrated in FIG. 1C, a structure in which an inner turn is thicker than an outer turn and the bottoms of these turns are flush with each other may be employed. The conductor illustrated in FIG. 1C has the same function and advantages as those of the conductor illustrated in FIG. 1B. Accordingly, in the spiral conductor 11, it is sufficient that the level of the bottom or top of the conductor 11 differs between different turns.

This embodiment is now more specifically described with reference to FIG. 1A. The turns of the spiral conductor 11 are equally spaced from each other in the direction parallel to the plane on which the conductor 11 is formed. In such a conductor 11, an outer turn is wider than an inner turn. For example, in the conductor 11 illustrated in FIG. 1A, the distance between the innermost turn 11c and the intermediate turn 11b is equal to the distance between the intermediate turn 11b and the outermost turn 11a, and the width increases in the order of the innermost turn 11c, the intermediate turn 11b, and the outermost turn 11a.

In this conductor 11, the distance between the center 15 of the inductor 10 and the innermost turn 11c is larger than that in a conductor having a uniform width. Accordingly, the conductor 11 is less affected by the vertical component of magnetic flux linking the conductor 11. In addition, in the conductor 11, an inner turn is narrower and thicker than an outer turn, thus suppressing an increase in the series resistance of the inductor 10 due to the reduction of the conductor width. Furthermore, in the conductor 11, an outer turn does not need to be thicker, and thus an increase in capacitance between adjacent turns can be suppressed.

As described above, in this embodiment, the vertical component of magnetic flux linking the conductor 11 can be reduced, thus reducing the total eddy current loss. This can prevent an increase in the series resistance of the inductor 10, resulting in suppression of a decrease in the Q factor of the inductor 10.

In the conductor 11 of this embodiment, an inner turn is narrower and thicker than an outer turn. Accordingly, an increase in the series resistance of the inductor 10 can be suppressed, thus further suppressing a decrease in the Q factor of the inductor 10. In addition, an increase in capacitance between adjacent turns of the conductor 11 can be suppressed, thus suppressing a decrease in the Q factor of the inductor 10 in a high-frequency range.

Embodiment 2

Figure 2A:
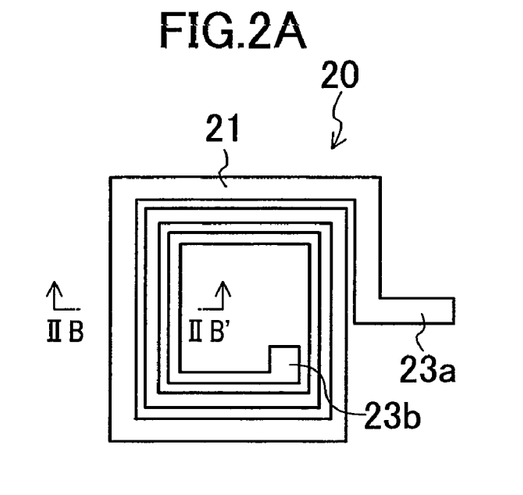
FIG. 2A is a plan view illustrating an inductor according to a second embodiment of the present invention.
Figure 2B:
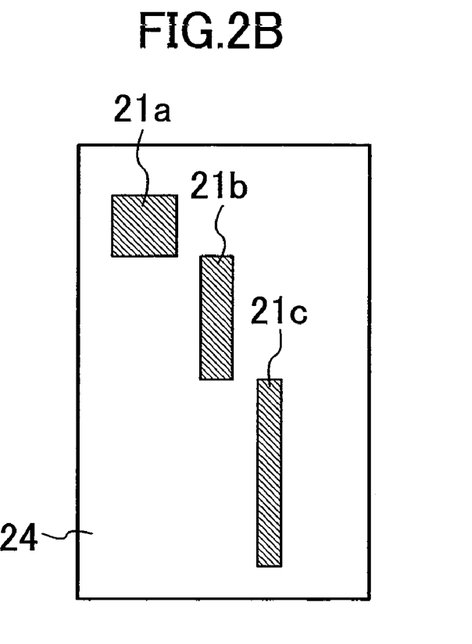
FIG. 2B is a cross-sectional view of the inductor of the second embodiment.
Figure 2C:
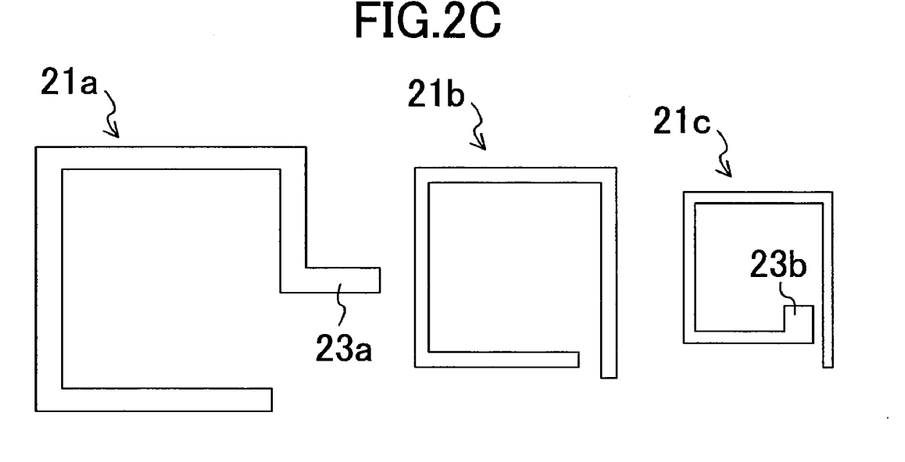
FIG. 2C is a plan view illustrating spiral shapes in respective layers of the inductor of the second embodiment.
Figure 3A:
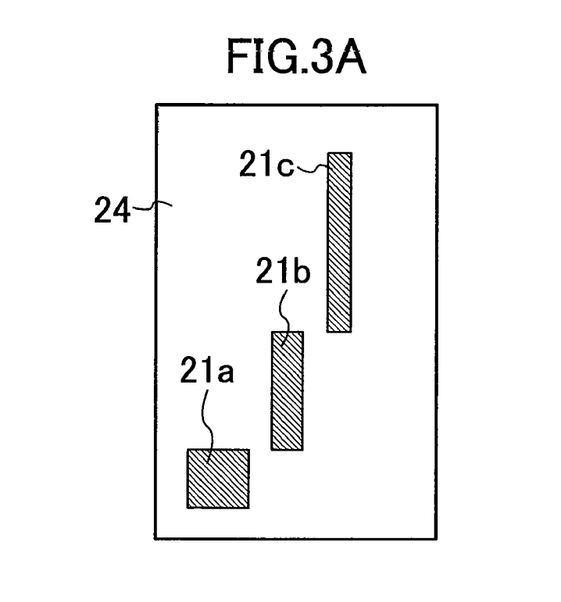
FIG. 3A is a cross-sectional view of another inductor according to the second embodiment.
Figure 3B:
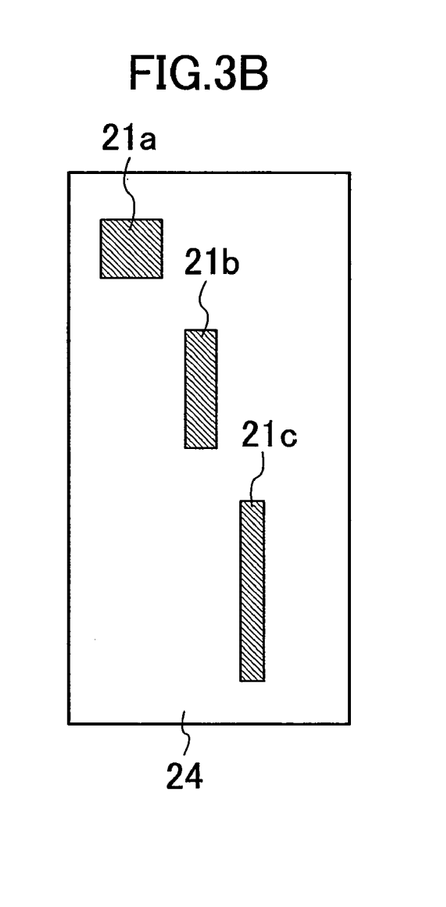
FIG. 3B is a cross-sectional view of still another inductor of the second embodiment.
Figure 3C:
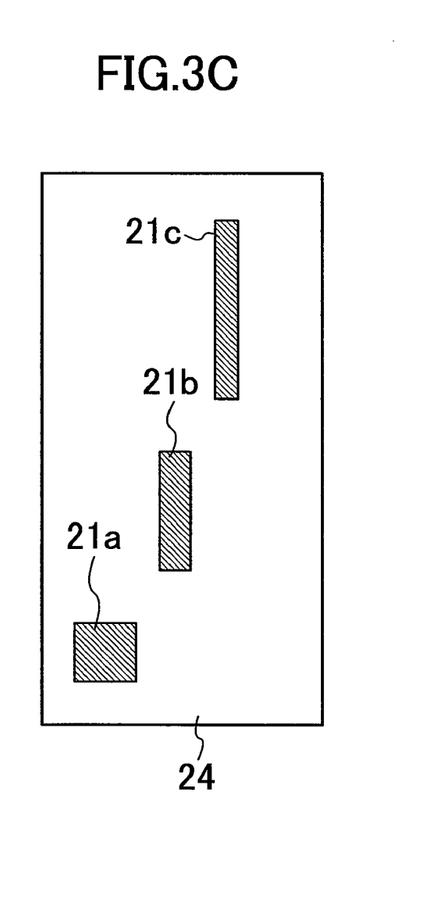
FIG. 3C is a cross-sectional view of yet another inductor of the second embodiment.

FIG. 2A is a plan view illustrating an inductor 20 having a spiral shape according to a second embodiment of the present invention. FIG. 2B is a cross-sectional view taken along line IIB-IIB' in FIG. 2A. FIG. 2C is a plan view illustrating spiral shapes in respective layers. FIGS. 3A through 3C are other examples of the cross-sectional view taken along line IIB-IIB' in FIG. 2A.

As illustrated in FIG. 2A, the inductor 20 includes a substrate (not shown) and a conductor 21 having a spiral shape. The outer and inner ends of the conductor 21 serve as a terminal 23a and a terminal 23b respectively. Current which has entered the terminal 23a is obtained from the terminal 23b. As illustrated in FIG. 2B, the conductor 21 (only whose turns 21a, 21b, and 21c are shown in FIG. 2B) is provided in an interlayer insulating film 24 formed on the substrate. Each of the turns 21a, 21b, and 21c is rectangular in a cross section taken along the width of the turns 21a, 21b, and 21c.

Referring now to FIG. 2B, the bottom of the outer one of two adjacent turns is flush with the top of the inner one of the turns in this embodiment. For example, in the conductor 21 illustrated in FIG. 2B, the bottom of the outermost turn 21a is flush with the top of the intermediate turn 21b, and the bottom of the intermediate turn 21b is flush with the top of the innermost turn 21c.

This structure allows the distance between adjacent turns of the conductor 21 of this embodiment to be larger than that of the conductor 11 of the first embodiment. Accordingly, the influence of a magnetic field produced in energizing the inductor, for example, is reduced. In addition, the levels of the top and bottom of the conductor 21 of this embodiment differ between different turns. Accordingly, as in the first embodiment, a magnetic flux component vertical to the plane on which the conductor 21 is formed can be reduced. These features can reduce the total eddy current loss, thus suppressing an increase in the series resistance of the inductor 20. Moreover, the increase in the distance between adjacent turns of the conductor 21 reduces capacitance between adjacent turns of the conductor 21, resulting in suppressing a decrease in the Q factor of the inductor 20 in a high-frequency range.

More specifically, in the conductor 21 of this embodiment, as illustrated in FIG. 2B, the outermost turn 21a is located at the highest level, the intermediate turn 21b is located at an intermediate level, and the innermost turn 21c is located at the lowest level in the interlayer insulating film 24. As illustrated in FIG. 2C, the terminal 23a is provided at an end of the outermost turn 21a, and the bottom of the other end of the outermost turn 21a is electrically connected to the top of one end of the intermediate turn 21b. The bottom of the other end of the intermediate turn 21b is electrically connected to the top of one end of the innermost turn 21c, and the terminal 23b is provided at the other end of the innermost turn 21c.

As illustrated in FIG. 3A, the top of the outer one of two adjacent turns of the conductor may be flush with the bottom of the inner one of the turns. For example, in the conductor shown in FIG. 3A, the top of the outermost turn 21a is flush with the bottom of the intermediate turn 21b, and the top of the intermediate turn 21b is flush with the bottom of the innermost turn 21c. Even in this case, substantially the same advantages as those of the conductor 21 shown in FIG. 2B can be obtained.

As illustrated in FIG. 3B, the bottom of the outer one of two adjacent turns of the conductor may be located above the top of the inner one of the turns. In this case, as shown in FIG. 2C, the terminal 23a is provided at an end of the outermost turn 21a, and the bottom of the other end of the outermost turn 21a is electrically connected to the top of an end of the intermediate turn 21b through a conductive material (not shown) provided in a via (not shown). The bottom of the other end of the intermediate turn 21b is electrically connected to the top of an end of the innermost turn 21c through a conductive material (not shown) provided in a via (not shown). The terminal 23b is provided at the other end of the innermost turn 21c. Even in this case, substantially the same advantages as those of the conductor 21 shown in FIG. 2B can be obtained.

Moreover, as illustrated in FIG. 3C, the top of the outer one of two adjacent turns of the conductor may be located below the bottom of the inner one of the turns. In this case, as shown in FIG. 2C, the terminal 23a is provided at an end of the outermost turn 21a, and the top of the other end of the outermost turn 21a is electrically connected to the bottom of an end of the intermediate turn 21b through a conductive material (not shown) provided in a via (not shown). The top of the other end of the intermediate turn 21b is electrically connected to the bottom of an end of the innermost turn 21c through a conductive material (not shown) provided in a via (not shown). The terminal 23b is provided at the other end of the innermost turn 21c. Even in this case, substantially the same advantages as those of the conductor 21 shown in FIG. 2B can be obtained.

The conductor 21 of this embodiment is now more specifically described with reference to FIG. 2A. In the conductor 21 of this embodiment, the turns of the conductor 21 are equally spaced from each other in the direction parallel to the plane on which the conductor 21 is formed, as in the conductor 11 of the first embodiment. In such a conductor 21, an outer turn is wider than an inner turn. Accordingly, the conductor 21 is less affected by a vertical component of magnetic flux linking the conductor 21 than a conductor having a uniform width.

In the conductor 21 of this embodiment, an outer turn is narrower and thicker than an inner turn, as in the conductor 11 of the first embodiment. Accordingly, an increase in the series resistance of the inductor 20 can be suppressed, and thus a decrease of the Q factor of the inductor 20 can be suppressed. In addition, in this embodiment, an outer turn does not need to be thicker, as in the first embodiment. Accordingly, an increase in capacitance between adjacent turns of the conductor 21 can be suppressed. As a result, a decrease in the Q factor of the inductor 20 in a high-frequency range can be suppressed.

As described above, the conductor 21 of this embodiment not only has advantages of the conductor 11 of the first embodiment, but also allows the distance between adjacent turns of the conductor to be increased. Accordingly, an additional advantage of reduction of the influence of a magnetic field produced in energizing the inductor, for example, can be obtained.

Embodiment 3

Figure 4A:
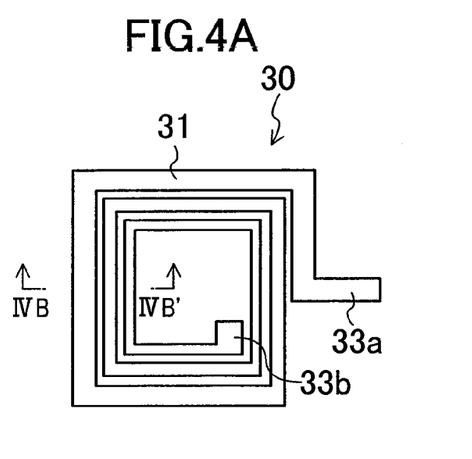
FIG. 4A is a plan view illustrating an inductor according to a third embodiment of the present invention.
Figure 4B:
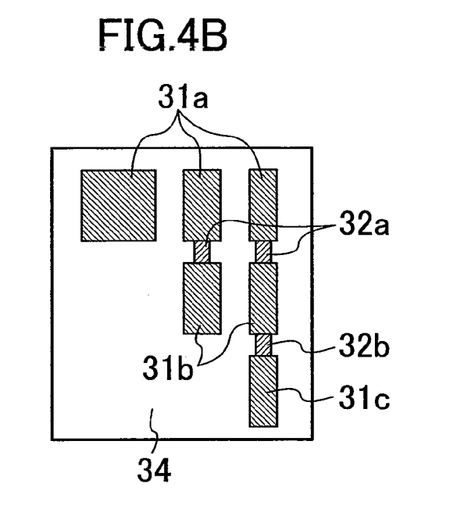
FIG. 4B is a cross-sectional view of the inductor of the third embodiment.
Figure 4C:
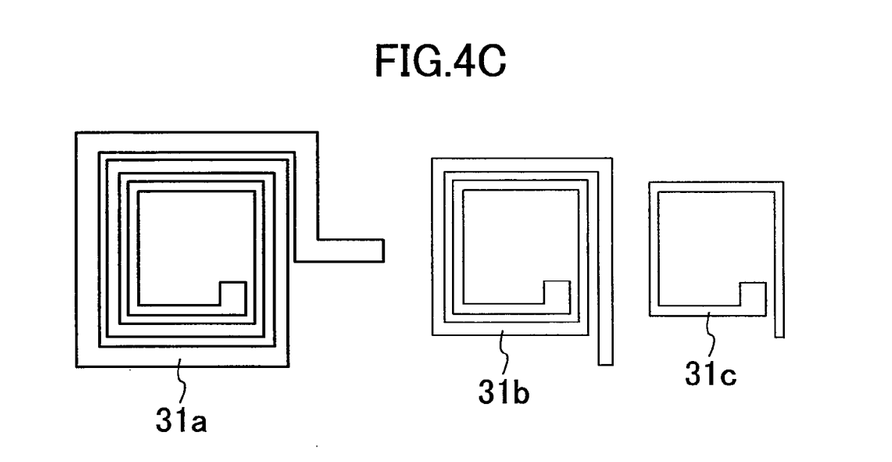
FIG. 4C is a plan view illustrating spiral shapes in respective layers of the inductor of the third embodiment.

FIG. 4A is a plan view illustrating an inductor 30 having a spiral shape according to a third embodiment of the present invention. FIG. 4B is a cross-sectional view taken along line IVB-IVB' in FIG. 4A. FIG. 4C is a plan view illustrating spiral shapes in respective layers.

As illustrated in FIG. 4A, the inductor 30 includes a substrate (not shown) and a conductor 31 having a spiral shape. The outer and inner ends of the conductor 31 serve as a terminal 33a and a terminal 33b respectively. Current which has entered the terminal 33a is obtained from the terminal 33b. As illustrated in FIG. 4B, the conductor 31 (only whose first-, second-, and third-layer portions 31a, 31b, 31c are shown in FIG. 4B) is provided in an interlayer insulating film 34 formed on the substrate. Each of the first-through third-layer portions 31a through 31c is rectangular in a cross section taken along the width of the portions 31a through 31c.

As in the conductor 11 of the first embodiment, the turns of the spiral conductor 31 are equally spaced from each other in the direction parallel to the plane on which the conductor 31 is formed. An outer turn of the conductor 31 is wider and thinner than an inner turn of the conductor 31. The bottom of the outer turn is located at a different level from the bottom of the inner turn. However, the specific structure of the conductor 31 is different from that of the conductor 11.

As illustrated in FIG. 4C, the conductor 31 includes the first-layer portion 31a, the second-layer portion 31b, and the third-layer portion 31c. The first-layer portion 31a has a spiral shape as shown in FIG. 4C. An outer turn of this first-layer portion 31a is wider than, but has the same thickness as, an inner turn of the first-layer portion 31a.

As the first-layer portion 31a, the second-layer portion 31b also has a spiral shape. An outer turn of this second-layer portion 31b is wider than an inner turn of the second-layer portion 31b. The outermost turn of the second-layer portion 31b has the same width as the innermost turn of the first-layer portion 31a.

The third-layer portion 31c also has a spiral shape, and has a width equal to the width of the innermost turn of the second-layer portion 31b.

As shown in FIG. 4B, the outermost turn of the conductor 31 is constituted by the outermost turn of the first-layer portion 31a. An intermediate turn of the conductor 31 is constituted by an intermediate turn of the first-layer portion 31a and the outermost turn of the second-layer portion 31b which are electrically connected to each other through a conductive material 32a provided in a via or a trench. Accordingly, the bottom of the outermost turn of the conductor 31 is located above the bottom of the intermediate turn of the conductor 31.

In the same manner, the innermost turn of the conductor 31 is constituted by the innermost turn of the first-layer portion 31a, the innermost turn of the second-layer portion 31b, and the third-layer portion 31c. The innermost turn of the first-layer portion 31a and the innermost turn of the second-layer portion 31b are electrically connected to each other through a conductive material 32a provided in a via or a trench. The innermost turn of the second-layer portion 31b and the third-layer portion 31c are electrically connected to each other through a conductive material 32b provided in a via or a trench. Accordingly, the bottom of the intermediate turn of the conductor 31 is located above the bottom of the innermost turn of the conductor 31.

It should be noted that vias or trenches are actually formed throughout the surface of the second-layer portion 31b to electrically connect the first-layer portion 31a and the second-layer portion 31b to each other. In the same manner, vias or trenches are formed throughout the surface of the third-layer portion 31c to electrically connect the second-layer portion 31b and the third-layer portion 31c to each other.

In this manner, a plurality of interconnection layers are connected to one another through conductive materials provided in vias or trenches in this embodiment. Accordingly, the inductor of this embodiment has a cross-sectional structure similar to that of the inductor of the first embodiment, and is allowed to be formed simultaneously with formation of interconnections for transistors. Then, a method for fabricating a multilayer interconnection structure according to this embodiment is described with reference to FIGS. 5A through 5E and FIGS. 6A through 6D.

First, although not shown, a semiconductor substrate (not shown) provided with, for example, a given transistor and a lower-layer interconnection is prepared, and then a SiN film as a first etch-stopper insulating film 41a is deposited by plasma chemical vapor deposition (CVD) to a thickness of 50 nm over the surface of an interlayer insulating film in which the lower-layer interconnection is buried. Since SiN has a higher dielectric constant than $SiO_2$ used as a material for the interlayer insulating film, the use of SiN as a material for the first etch-stopper insulating film 41a increases wire-to-wire capacitance. Hence, the thickness of the SiN film is preferably as small as possible. It should be noted that $SiO_2$ is a constituent of the interlayer insulating film, and therefore cannot be used as a material for the etch-stopper insulating film.

Figure 5A:
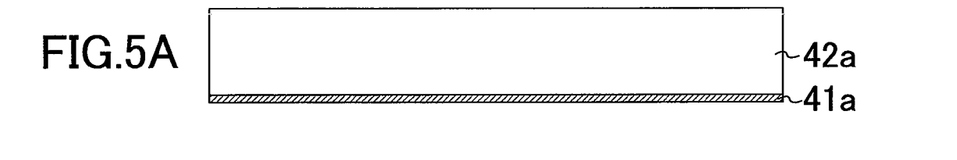
FIGS. 5A through 5E are cross-sectional views showing process steps of a method for fabricating an inductor according to the third embodiment.

Next, a first interlayer insulating film 42a with a thickness of 2 μm is formed on the upper surface of the first etch-stopper insulating film 41a (see FIG. 5A).

Then, after the formation of the first interlayer insulating film 42a, a resist mask (not shown) for forming, in the first interlayer insulating film 42a, a first connection portion 43a and a first conductor 44a (i.e., the third-layer portion 31c) for an inductor is formed on the upper surface of the first interlayer insulating film 42a. At this time, this resist mask includes: a circular pattern (i.e., a pattern for forming a first connection portion 43a) provided in an interconnection region 45; and a linear pattern (i.e., a pattern for forming a first conductor 44a for an inductor) provided in an inductor region 46. In this example, the circular pattern has a diameter of 0.5 µm, and the linear pattern has a width of 0.5 µm to 10 µm.

Figure 5B:
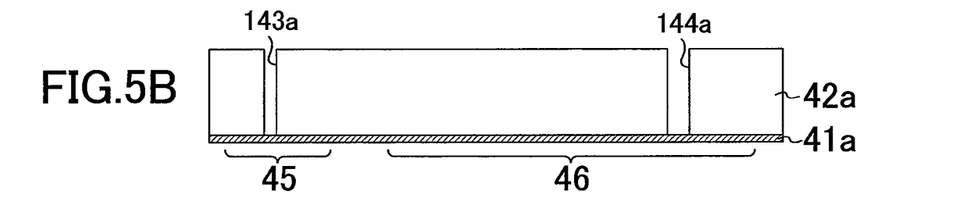

After the formation of the resist mask on the upper surface of the first interlayer insulating film 42a, the first interlayer insulating film 42a is etched with the resist mask used as an etch mask, thereby forming a hole 143a for forming a first connection portion 43a and a trench 144a for forming a first conductor 44a (see FIG. 5B). At this time, in the inductor region 46, the trench 144a penetrates the first interlayer insulating film 42a in the thickness direction thereof, and thus has a depth substantially equal (i.e., 2 µm) to the thickness of the first interlayer insulating film 42a. In etching the first interlayer insulating film 42a, selective etching is employed such that the etching stops at the first etch-stopper insulating film 41a (i.e., the first etch-stopper insulating film 41a is not etched). After the etching, the resist mask is removed.

After the removal of the resist mask, a resist mask for forming a first interconnection 47a in the interconnection region 45 is formed on the upper surface of the first interlayer insulating film 42a. Then, the first interlayer insulating film 42a is etched with this resist mask used as an etch mask, thereby forming a trench 147a for forming a first interconnection 47a (see FIG. 5C). The trench 147a for forming a first interconnection 47a in this interconnection region 45 has a depth of 1 µm.

Figure 5C:
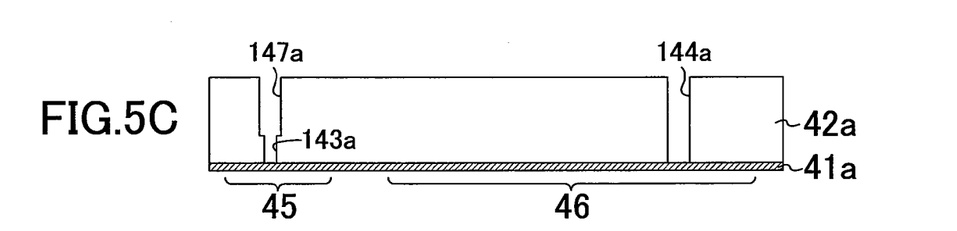

After the etching, the resist mask is removed. Then, portions of the first etch-stopper insulating film 41a exposed at the bottom of the hole 143a for forming a first connection portion 43a in the first interlayer insulating film 42a and at the bottom of the trench 144a for forming a first conductor 44a in the first interlayer insulating film 42a are removed by etching. Thereafter, a first barrier tantalum nitride (TaN) film 48a with a thickness of 20 nm and a seed layer (not shown) with a thickness of 200 nm made of copper (Cu) are deposited by sputtering over the inner surface of the hole 143a for forming a first connection portion 43a, the inner surface of trench 147a for forming a first interconnection 47a, and the inner surface of the trench 144a for forming a first conductor 44a. The material for the first barrier TaN film 48a only needs to be conductive. In stead of TaN, titanium nitride (TiN) or tungsten nitride (WN) may be used, for example.

Figure 5D:
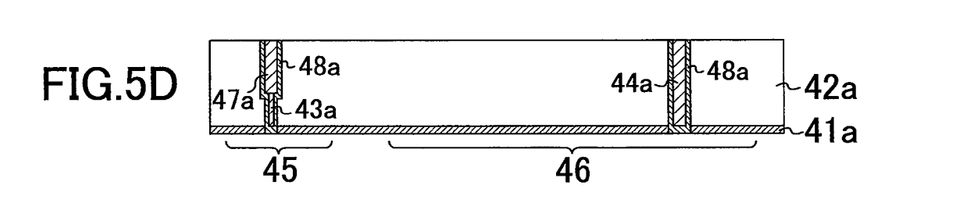

Subsequently, by electrolytic plating, Cu is buried in the hole 143a for forming a first connection portion 43a, the trench 147a for forming a first interconnection 47a, and the trench 144a for forming a first conductor 44a. The thickness of the buried Cu is about 2.6 µm. Then, Cu and TaN outside the hole 143a for forming a first connection portion 43a, the trench 147a for forming a first interconnection 47a, and the trench 144a for forming a first conductor 44a are removed by chemical mechanical polishing (CMP). In this manner, a first interconnection 47a, a first connection portion 43a, and a first conductor 44a are formed, thereby forming an interconnection structure having a cross section as illustrated in FIG. 5D. Electroless plating is also applicable to similar formation of an interconnection layer.

Thereafter, a SiN film as a second etch-stopper insulating film 41b is deposited by plasma CVD to a thickness of 50 nm over the surface of the first interlayer insulating film 42a in which the first interconnection 47a, the first connection portion 43a, and the first conductor 44a are buried. A second interlayer insulating film 42b with a thickness of 2 µm is then formed on the second etch-stopper insulating film 41b (see FIG. 5E).

Figure 5E:
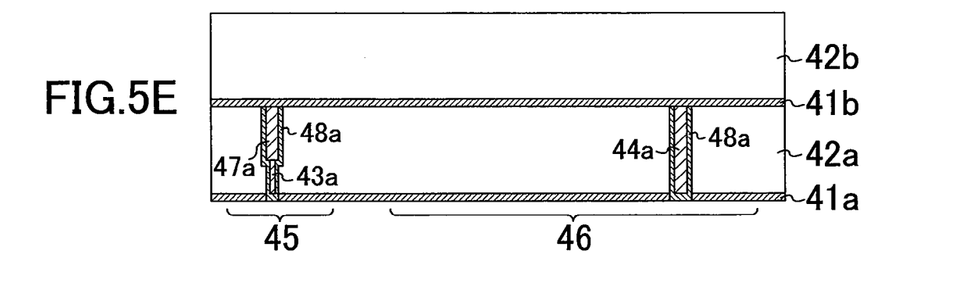

After the formation of the second interlayer insulating film 42b, a resist mask for forming, in the second interlayer insulating film 42b, a second connection portion 43b and a second conductor 44b (i.e., the second-layer portion 31b) for an inductor is formed on the upper surface of the second interlayer insulating film 42b. This resist mask includes: a circular pattern (i.e., a pattern for forming a second connection portion 43b) provided in the interconnection region 45; and a linear pattern (i.e., a pattern for forming a second conductor 44b for an inductor) provided in the inductor region 46. In this example, the circular pattern has a diameter of 0.5 µm, and the linear pattern has a width of 0.5 µm to 10 µm. The linear pattern is composed of two types of patterns having different widths: a narrow pattern and a wide pattern. The narrow pattern is preferably located directly above the first conductor 44a. The wide pattern is preferably located at an outer side (i.e., closer to the periphery) than the narrow pattern.

Figure 6A:
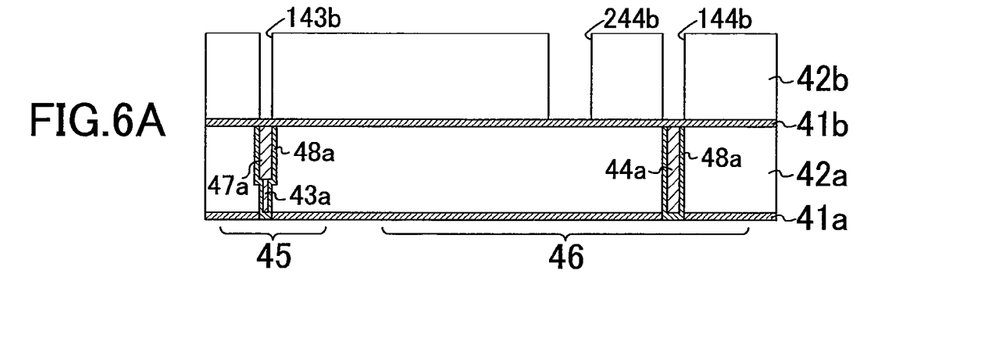
FIGS. 6A through 6D are cross-sectional views showing process steps of the method for fabricating an inductor according to the third embodiment.

After the formation of the resist mask on the upper surface of the second interlayer insulating film 42b, the second interlayer insulating film 42b is etched with the resist mask used as an etch mask, thereby forming a hole 143b for forming a second connection portion 43b and trenches 144b and 244b for forming second conductors 44b in the second interlayer insulating film 42b (see FIG. 6A). At this time, in the inductor region 46, the trenches 144b and 244b penetrate the second interlayer insulating film 42b in the thickness direction thereof, and thus have a depth substantially equal (i.e., 2 µm) to the thickness of the second interlayer insulating film 42b. In etching the second interlayer insulating film 42b, selective etching is employed such that the etching stops at the second etch-stopper insulating film 41b (i.e., the second etch-stopper insulating film 41b is not etched). With this etching, two trenches 144b and 244b for forming second conductors 44b are formed in the second interlayer insulating film 42b. The two trenches 144b and 244b have different widths. The narrow trench 144b is located directly above the first conductor 44a. The wide trench 244b is located at an outer side (i.e., closer to the periphery) than the narrow trench 144b.

After the etching, the resist mask is removed. Then, a resist mask for forming a second interconnection 47b in the interconnection region 45 is formed on the upper surface of the second interlayer insulating film 42b. Thereafter, the second interlayer insulating film 42b is etched with the resist mask used as an etch mask, thereby forming a trench 147b for forming a second interconnection 47b (see FIG. 6B). The trench 147b for forming a second interconnection 47b in the interconnection region 45 has a depth of 1 µm. After the etching, the resist mask is removed. Then, portions of the second etch-stopper insulating film 41b exposed at the bottom of the hole 143b for forming a second connection portion 43b in the second interlayer insulating film 42b and at the bottoms of the trenches 144b and 244b for forming second conductors 44b in the second interlayer insulating film 42b are removed by etching.

Figure 6B:
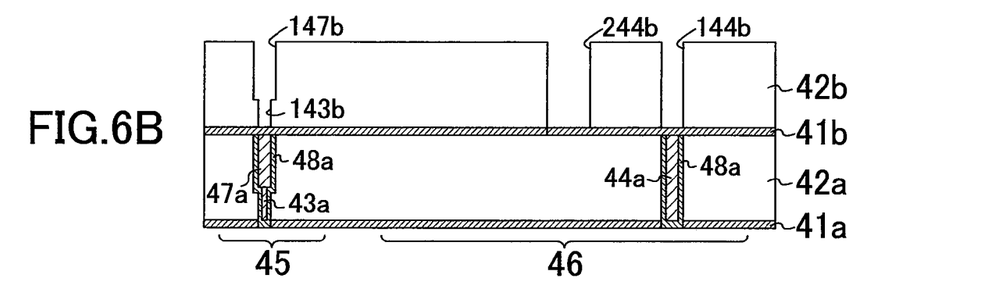

Subsequently, a second barrier TaN film 48b is deposited by sputtering to a thickness of 20 nm over the inner surface of the hole 143b for forming a second connection portion 43b, the inner surface of the trench 147b for forming a second interconnection 47b, and the inner surfaces of the trenches 144b and 244b for forming second conductors 44b. On the second barrier TaN film 48b, a seed layer (not shown) made of Cu and having a thickness of 200 nm is formed. As in the case of the first barrier TaN film 48a, the second barrier TaN film 48b only needs to be made of a conductive material.

Figure 6C:
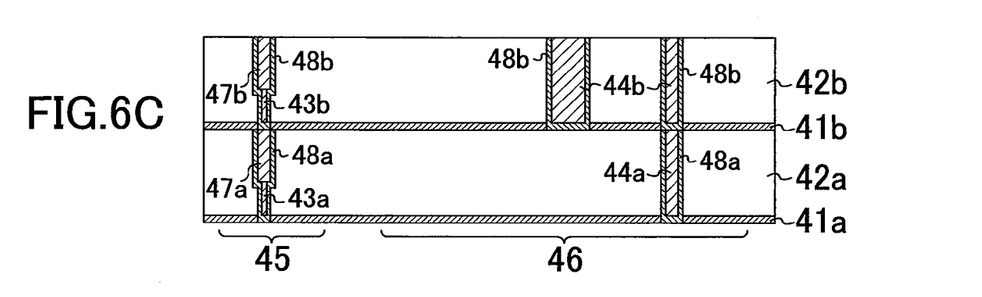

Then, by electrolytic plating, Cu is buried in the hole 143b for forming a second connection portion 43b, the trench 147b for forming a second interconnection 47b, and the trenches 144b and 244b for forming second conductors 44b. The thickness of the buried Cu is about 2.6 µm. Then, Cu and TaN outside the hole 143b for forming a second connection portion 43b, the trench 147a for forming a second interconnection 47b, and the trenches 144b and 244b for forming second conductors 44b are removed by CMP. In this manner, a second interconnection 47b, a second connection portion 43b, and second conductors 44b are formed, thereby forming a multilayer interconnection structure having a cross section as illustrated in FIG. 6C.

Thereafter, a SiN film as a third etch-stopper insulating film 41c is deposited by plasma CVD to a thickness of 50 nm over the surface of the second interlayer insulating film 42b in which the second interconnection 47b, the second connection portion 43b, and the second conductors 44b are buried. A third interlayer insulating film 42c with a thickness of 2 μm is then formed on the third etch-stopper insulating film 41c. Thereafter, a resist mask for forming a third connection portion 43c and a third conductor 44c (i.e., the first-layer portion 31a) is formed on the upper surface of the third interlayer insulating film 42c. This resist mask includes: a circular pattern (i.e., a pattern for forming a third connection portion 43c) provided in the interconnection region 45; and a linear pattern (i.e., a pattern for forming a third conductor 44c) provided in the inductor region 46. In this example, the circular pattern has a diameter of 0.5 μm, and the linear pattern has a width of 0.5 μm to 10 μm. The linear pattern is composed of three types of patterns having different widths: a first-narrowest pattern (which is the narrowest of the three types of patterns); a second-narrowest pattern; and a third-narrowest pattern. The first-narrowest pattern is preferably located directly above the narrower one of the second conductors 44b. The second-narrowest pattern is preferably located directly above the wider one of the second conductors 44b. The third-narrowest pattern is located at an outer side (i.e., closer to the periphery) than the second-narrowest pattern.

Figure 6D:
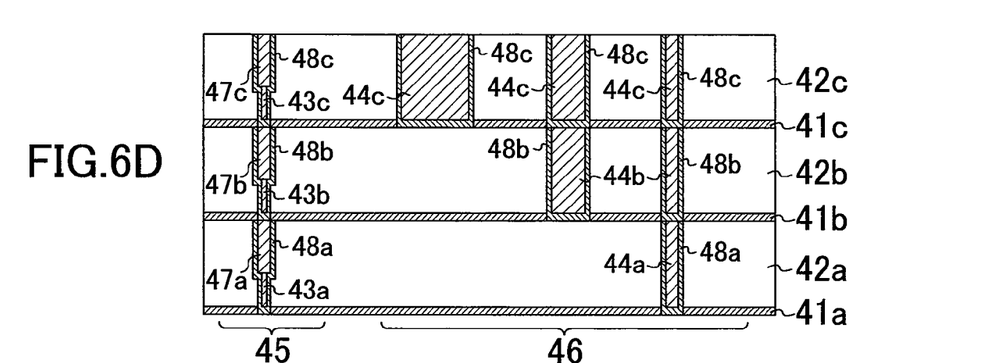

The third interlayer insulating film 42c is etched with the resist mask used as an etch mask, thereby forming a hole (not shown) for forming a third connection portion 43c and trenches (not shown) for forming third conductors 44c for an inductor in the third interlayer insulating film 42c. At this time, in the inductor region 46, the trenches penetrate the third interlayer insulating film 42c in the thickness direction thereof, and thus has a depth substantially equal (i.e., 2 μm) to the thickness of the third interlayer insulating film 42c. In etching the third interlayer insulating film 42c, selective etching is employed such that the etching stops at the third etch-stopper insulating film 41c (i.e., the third etch-stopper insulating film 41c is not etched). With this etching, three trenches for forming third conductors 44c for an inductor are formed in the third interlayer insulating film 42c. These three trenches have different widths. The first-narrowest trench (which is the narrowest of the three trenches) is located directly above the narrower one of the second conductors 44b. The second-narrowest trench is located directly above the wider one of the second conductors 44b. The third-narrowest trench is located at an outer side (i.e., closer to the periphery) than the second-narrowest trench.

After the etching, the resist mask is removed. Then, a resist mask for forming a third interconnection 47c in the interconnection region 45 is formed on the upper surface of the third interlayer insulating film 42c. The third interlayer insulating film 42c is etched with this resist mask used as an etch mask, thereby forming a trench (not shown) for forming a third interconnection 47c. The trench for forming a third interconnection 47c in the interconnection region 45 has a depth of 1 μm. After the etching, the resist mask is removed. Then, portions of the third etch-stopper insulating film 41c exposed at the bottom of the hole for forming a third connection portion 43c in the third interlayer insulating film 42c and at the bottoms of the trenches for forming third conductors 44c in the third interlayer insulating film 42c are removed by etching.

Thereafter, a third barrier TaN film 48c is deposited by sputtering to a thickness of 20 nm over the inner surface of the hole for forming a third connection portion 43c, the inner surface of the trench for forming a third interconnection 47c, and the inner surfaces of the trenches for forming third conductors 44c. On the third barrier TaN film 48c, a seed layer (not shown) made of Cu and having a thickness of 200 nm is formed. As in the case of the second barrier TaN film 48b, the third barrier TaN film 48c only needs to be made of a conductive material.

Then, by electrolytic plating, Cu is buried in the hole for forming a third connection portion 43c, and the trench for forming a third interconnection 47c, and the trenches for forming third conductors 44c. The thickness of the buried Cu is about 2.6 μm. Then, Cu and TaN outside the hole for forming a third connection portion 43c, the trench for forming a third interconnection 47c, and the trenches for forming third conductors 44c are removed by CMP. In this manner, a third interconnection 47c, a third connection portion 43c, and third conductors 44c are formed, thereby forming a multilayer interconnection structure having a cross section as illustrated in FIG. 6D.

In this manner, in this embodiment, the level of the bottom of the conductor 31 differs between different turns. Accordingly, as in the first embodiment, a magnetic flux component vertical to the plane on which the conductor 31 is formed can be reduced. Consequently, the total eddy current loss can be reduced, thus suppressing an increase in the substantial series resistance of the inductor 30. In addition, an increase in capacitance between adjacent turns of the conductor 31 can be suppressed, resulting in suppressing a decrease in the Q factor of the inductor 30 in a high-frequency range.

As illustrated in FIG. 1C, the level of the top of the conductor 31 may differ between different turns. Even in such a case, advantages similar to those of this embodiment can be achieved.

Embodiment 4

Figure 7A:
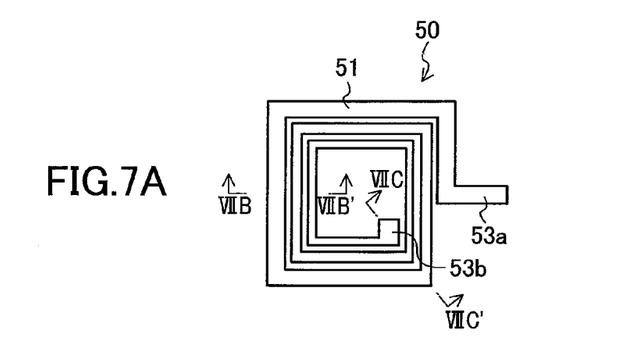
FIG. 7A is a plan view illustrating an inductor according to a fourth embodiment of the present invention.
Figure 7B:
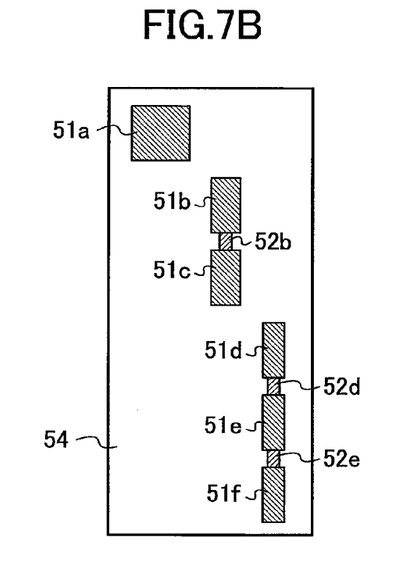
FIG. 7B is a cross-sectional view of the inductor of the fourth embodiment.
Figure 7C:
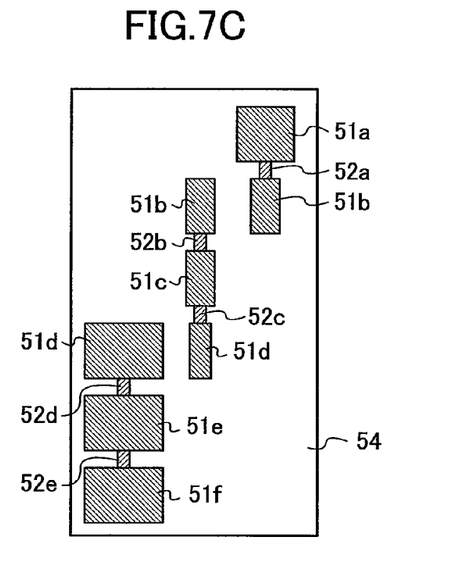
FIG. 7C is another cross-sectional view of the inductor of the fourth embodiment.
Figure 7D:
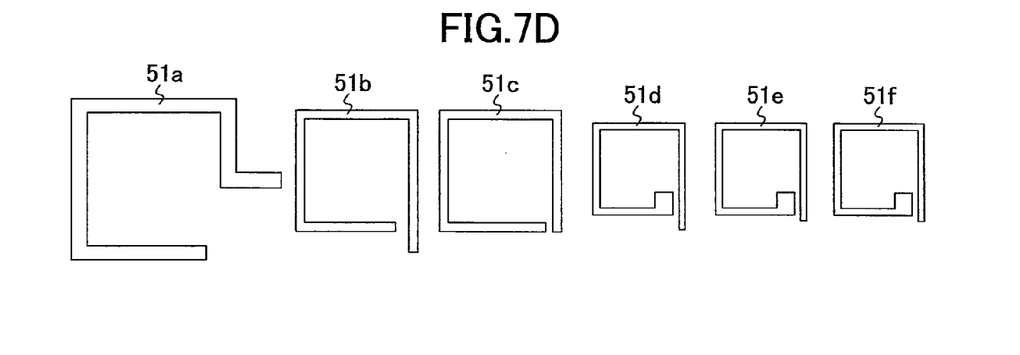
FIG. 7D is a plan view illustrating spiral shapes in respective layers of the inductor of the fourth embodiment.

FIG. 7A is a plan view illustrating an inductor 50 having a spiral shape according to a fourth embodiment of the present invention. FIG. 7B is a cross-sectional view taken along line VIIB-VIIB' in FIG. 7A. FIG. 7C is a cross-sectional view taken along line VIIC-VIIC' in FIG. 7A. FIG. 7D is a plan view illustrating spiral shapes in respective layers.

As illustrated in FIG. 7A, the inductor 50 includes a substrate (not shown) and a conductor 51 having a spiral shape. The outer and inner ends of the conductor 51 serve as a terminal 53a and a terminal 53b respectively. Current which has entered the terminal 53a is obtained from the terminal 53b. As illustrated in FIG. 7B, the conductor 51 (only whose first-, second-, third-, fourth-, fifth-, and sixth-layer portions 51a, 51b, 51c, 51d, 51e, and 51f are shown in FIG. 7B) is provided in an interlayer insulating film 54 formed on the substrate. Each of the first- through sixth-layer portions 51a through 51f is rectangular in a cross section taken along the width of the portions 51a, for example.

As in the conductor 21 of the second embodiment, the turns of the spiral conductor 51 are equally spaced from each other in the direction parallel to the plane on which the conductor 51 is formed. An outer turn of the conductor 51 is wider and thinner than an inner turn of the conductor 51. The top and bottom of the outer turn are respectively located at different levels from those of the inner turn. However, the specific structure of the conductor 51 is different from that of the conductor 21.

The conductor 51 includes the first-layer portion 51a, the second-layer portion 51b, the third-layer portion 51c, the fourth-layer portion 51d, the fifth-layer portion 51e, and the sixth-layer portion 51f. Each of these portions has a spiral shape. With respect to the width, the first-layer portion 51a is the widest of these conductor portions, the second-layer portion 51b and the third-layer portion 51c have an identical width, the fourth-layer portion 51d, the fifth-layer portion 51e, and the sixth-layer portion 51f have an identical width and are the narrowest.

In the interlayer insulating film 54, the first-layer portion 51a, the second-layer portion 51b, the third-layer portion 51c, the fourth-layer portion 51d, the fifth-layer portion 51e, and the sixth-layer portion 51f are arranged in this order from the top to the bottom of the interlayer insulating film 54. The first-layer portion 51a constitutes the outermost turn of the conductor 51. The second-layer portion 51b and the third-layer portion 51c constitute the intermediate turn of the conductor 51. The fourth-layer portion 51d, the fifth-layer portion 51e, and the sixth-layer portion 51f constitute the innermost turn of the conductor 51.

Specifically, as illustrated in FIG. 7A, the terminal 53a is provided at an end of the first-layer portion 51a. The other end of the first-layer portion 51a is electrically connected to an end of the second-layer portion 51b through a conductive material 52a provided in a via or a trench, as illustrated in FIG. 7C. As illustrated in FIGS. 7B and 7C, the second-layer portion 51b and the third-layer portion 51c are connected to each other through conductive materials 52b provided in a large number of vias or trenches. The vias or trenches are actually formed throughout the surface of the third-layer portion 51c.

As illustrated in FIG. 7C, an end of the third-layer portion 51c is connected to an end of the fourth-layer portion 51d through a conductive material 52c provided in a via or a trench. As illustrated in FIGS. 7B and 7C, the fourth-layer portion 51d and the fifth-layer portion 51e are connected to each other through conductive materials 52d provided in a large number of vias or trenches. The vias and trenches are actually formed throughout the surface of the fifth-layer portion 51e. The fifth-layer portion 51e and the sixth-layer portion 51f are connected to each other through conductive materials 52e provided in a large number of vias or trenches. The vias and trenches are actually formed throughout the surface of the sixth-layer portion 51f.

In this manner, in the conductor 51 of this embodiment, the bottom of the outermost first-layer portion 51a is located above the top of the intermediate second-layer portion 51b, and the bottom of the intermediate third-layer portion 51c is located above the top of the innermost fourth-layer portion 51d, for example. Accordingly, the inductor of this embodiment has a cross-sectional structure similar to that of the inductor of the second embodiment, and thus the same advantages as those of the second embodiment can be achieved. In other words, in this embodiment, the distance between adjacent turns of the conductor can be increased, thus reducing the influence of a magnetic field produced in energizing the inductor, for example. In addition, in the conductor 51 of this embodiment, the levels of the top and bottom of the conductor differ between different turns. Accordingly, a magnetic flux component vertical to the plane on which the conductor 51 is formed can be reduced, as in the second embodiment. These features can reduce the total eddy current loss, thus suppressing an increase in the series resistance of the inductor 50.

Moreover, as in the second embodiment, capacitance between adjacent turns of the conductor 51 can be reduced, resulting in suppressing a decrease in the Q factor of the inductor 50 in a high-frequency range.

To fabricate the multilayer interconnection structure of this embodiment, the method for fabricating a multilayer interconnection structure according to the third embodiment may be employed.

In the foregoing first through fourth embodiments, the inductor has a quadrilateral spiral shape. However, the spiral shape is not limited to quadrilaterals, and may be triangles, five or more sided polygons (i.e., pentagons, hexagon, and so forth), or circles.

In the third and fourth embodiments, a dual damascene process is employed in the fabrication method. However, the dual damascene process is not necessarily employed, and other processes may be employed.

In addition, the number of interconnection layers or turns of a spiral may be different from those described in the embodiments. As a conductive material for the conductor, materials such as Al may be used. To connect portions of the conductor, other conductive materials such as W may be used.

In the first through fourth embodiments, various modifications and changes may be made without departing from the scope of the invention as set forth in the claims below.

What is claimed is:

1. An inductor, comprising:
   a flat substrate; and
   a conductor in a spiral shape having a plurality of turns, wherein
   the conductor is provided substantially in parallel with a principal surface of the substrate,
   the turns of the conductor are equally spaced from each other in a direction parallel to a plane on which the conductor is formed,
   an outer one of the turns of the conductor is wider and thinner than an inner one of the turns of the conductor, and
   a level of at least one of a top and a bottom of the conductor differs from one turn to another in a cross section vertical to the plane on which the conductor is formed.

2. The inductor of claim 1, wherein a top of an inner one of the turns of the conductor is flush with or below a top of an outer one of the turns of the conductor in a cross section vertical to the plane on which the conductor is formed.

3. The inductor of claim 1, wherein a bottom of an inner one of the turn of the conductor is flush with or above a bottom of an outer one of the turns of the conductor in a cross section vertical to the plane on which the conductor is formed.

4. The inductor of claim 1, wherein a plurality of interconnection layers are stacked on the principal surface of the substrate with an insulating film sandwiched between each adjacent ones of the interconnection layers, and
   portions of the conductor respectively provided in at least two opposing ones of the interconnection layers are connected to each other through a conductive material provided in one of a via and a trench formed in the insulating film.

5. A method for fabricating an inductor including a flat substrate and a conductor in a spiral shape having a plurality of turns, the method comprising:
   forming a first trench through a first interlayer insulating film provided on the substrate, and forming a first portion of the conductor in the first trench;
   forming a second interlayer insulating film at a selected one of an upper surface and a lower surface of the first interlayer insulating film with an etch-stopper insulating film sandwiched between the first interlayer insulating film and the second interlayer insulating film; and forming second and third trenches through the second interlayer insulating film, and forming second and third portions of the conductor in the second and third trenches respectively, wherein the second trench has the same width as the first trench, and reaches a surface of the first portion of the conductor at the selected one of the upper and lower surfaces of the first interlayer insulating film, and the third trench is wider than the second trench, and is located closer to a periphery of the selected one of the upper and lower surfaces of the first interlayer insulating film than the second trench.

6. An inductor, comprising:

a substrate; and a spiral shape conductor having a plurality of turns, wherein the spiral shape conductor is provided substantially in parallel with a principal surface of the substrate, the plurality of turns of the spiral shape conductor are equally spaced from each other in a direction parallel to a plane on which the spiral shape conductor is formed, an outer one of the plurality of turns of the spiral shape conductor is wider and thinner than an inner one of the plurality of turns of the spiral shape conductor, and a level of at least one of a top and a bottom of the spiral shape conductor differs from one turn to another in a cross section vertical to the plane on which the spiral shape conductor is formed.

7. The inductor of claim 6, wherein a top of an inner one of the plurality of turns of the spiral shape conductor is flush with or below a top of an outer one of the plurality of turns of the spiral shape conductor in a cross section vertical to the plane on which the spiral shape conductor is formed.

8. The inductor of claim 6, wherein a bottom of an inner one of the plurality of turns of the spiral shape conductor is flush with or above a bottom of an outer one of the plurality of turns of the spiral shape conductor in a cross section vertical to the plane on which the spiral shape conductor is formed.

9. The inductor of claim 6, wherein a plurality of interconnection layers are stacked on the principal surface of the substrate with an insulating film sandwiched between each adjacent ones of the interconnection layers, and portions of the spiral shape conductor respectively provided in at least two opposing ones of the interconnection layers are connected to each other through a conductive material provided in one of a via and a trench formed in the insulating film.

10. A method for fabricating an inductor including a substrate and a spiral shape conductor having a plurality of turns, the method comprising:

forming a first trench through a first interlayer insulating film provided on the substrate, and forming a first portion of the spiral shape conductor in the first trench;

forming a second interlayer insulating film at a surface of the first interlayer insulating film with an etch-stopper insulating film sandwiched between the first interlayer insulating film and the second interlayer insulating film; and forming second and third trenches through the second interlayer insulating film, and forming second and third portions of the spiral shape conductor in the second and third trenches respectively, wherein the second trench reaches a surface of the first portion of the spiral shape conductor at the surface of the first interlayer insulating film, and the third trench is wider than the second trench.

11. A method for fabricating an inductor including of claim 10, wherein the second trench has the same width as the first trench.

12. A method for fabricating an inductor including of claim 10, wherein the third trench is located at the outer of the plurality of the turns, and the second trench is located at the inner of the plurality of the turns.

* * * * *